United States Patent
Noh et al.

(10) Patent No.: US 12,100,472 B2
(45) Date of Patent: Sep. 24, 2024

(54) INTEGRATED CIRCUIT AND MEMORY DEVICE INCLUDING SAMPLING CIRCUIT

(71) Applicant: SK hynix Inc., Gyeonggi-do (KR)

(72) Inventors: Jun Seok Noh, Gyeonggi-do (KR); Byeong Yong Go, Gyeonggi-do (KR); Sang Woo Yoon, Gyeonggi-do (KR); No Geun Joo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 183 days.

(21) Appl. No.: 17/993,635

(22) Filed: Nov. 23, 2022

(65) Prior Publication Data

US 2023/0420011 A1   Dec. 28, 2023

(30) Foreign Application Priority Data

Jun. 28, 2022  (KR) ........................ 10-2022-0078961

(51) Int. Cl.
*G11C 7/20*  (2006.01)
*G11C 7/10*  (2006.01)
*G11C 7/22*  (2006.01)

(52) U.S. Cl.
CPC ............ *G11C 7/109* (2013.01); *G11C 7/1093* (2013.01); *G11C 7/20* (2013.01); *G11C 7/22* (2013.01)

(58) Field of Classification Search
CPC ......... G11C 7/109; G11C 7/1093; G11C 7/20; G11C 7/22; G11C 11/408; G11C 11/40622; G11C 11/40611; G11C 11/4072; G11C 11/4076; G06F 7/588
See application file for complete search history.

(56) References Cited

U.S. PATENT DOCUMENTS

| 10,170,174 B1 | 1/2019 | Ito et al. |
| 10,229,728 B2 | 3/2019 | Morgan et al. |
| 2023/0141789 A1* | 5/2023 | Cho .................... G11C 11/4093 365/222 |

\* cited by examiner

*Primary Examiner* — Xiaochun L Chen
(74) *Attorney, Agent, or Firm* — IP & T GROUP LLP

(57) ABSTRACT

An integrated circuit includes a sampling control circuit configured to generate a sampling enable signal by dividing a sampling period into a plurality of sub-sections according to an active counting signal generated by counting a number of inputs of an active signal during the sampling period, and comparing the active counting signal with a random signal for each sub-section; and a sampling circuit configured to sample and store an input address according to the sampling enable signal.

27 Claims, 16 Drawing Sheets

INTEGRATED CIRCUIT AND MEMORY DEVICE INCLUDING SAMPLING CIRCUIT

CROSS-REFERENCE TO RELATED APPLICATION

The present application claims the benefit of Korean Patent Application No. 10-2022-0078961, filed on Jun. 28, 2022, which is incorporated herein by reference in its entirety.

BACKGROUND

1. Field

Various embodiments of the present invention relate to a semiconductor design technology, and more particularly, to a memory device including a sampling circuit that randomly samples input signals.

2. Description of the Related Art

Recently, in addition to a normal refresh operation, an additional refresh operation which will be, hereinafter, referred to as a 'target refresh operation', is being performed on the memory cells of a specific word line that is likely to lose data due to row hammering. The row hammering phenomenon refers to a phenomenon in which data of memory cells coupled to a specific word line or adjacent word lines disposed adjacent to the specific word line are damaged due to a high number of activations of the specific word line. In order to prevent the row hammering phenomenon, a target refresh operation is performed on a word line that is activated more than a predetermined number of times, and adjacent word lines disposed adjacent to the word line.

In the target refresh operation, word lines on which the target refresh operation is to be performed may be selected by randomly sampling addresses based on probability. Accordingly, research on a sampling circuit for randomly sampling addresses has been conducted.

SUMMARY

Embodiments of the present invention are directed to an integrated circuit and a memory device including a sampling circuit capable of randomly sampling addresses according to a sampling enable signal that is generated based on the number of active commands inputted during a sampling period.

According to an embodiment of the present invention, an integrated circuit includes a sampling control circuit configured to generate a sampling enable signal by dividing a sampling period into a plurality of sub-sections according to an active counting signal generated by counting a number of inputs of an active signal during the sampling period, and comparing the active counting signal with a random signal for each sub-section; and a sampling circuit configured to sample and store an input address according to the sampling enable signal.

According to an embodiment of the present invention, an integrated circuit includes a section definition circuit configured to divide a sampling period into a plurality of sub-sections according to an active counting signal representing a number of inputs of an active signal, and configured to generate a plurality of section definition signals respectively corresponding to the sub-sections; a sampling input control circuit configured to generate a sampling enable signal by comparing, according to the section definition signals, the active counting signal with a random signal; a reset signal generation circuit configured to output, as a reset signal, a high bit among a plurality of random bits of the random signal according to the section definition signals; a sampling output control circuit configured to output a first sampling output signal or a second sampling output signal according to the sampling enable signal and the reset signal; and a sampling circuit configured to output, according to the first sampling output signal, an address sampled by the sampling enable signal and configured to output, according to the second sampling output signal, an address sampled by a backup random signal.

According to an embodiment of the present invention, a memory device includes an active counter configured to generate an active counting signal by counting a number of inputs of an active command during a sampling period; a section definition circuit configured to generate, according to the active counting signal, a plurality of section definition signals for dividing a sampling period into a plurality of sub-sections; a control signal generation circuit configured to generate a sampling enable signal by comparing, according to the section definition signals, a random signal with the active counting signal; and a sampling circuit configured to output a target address by sampling an active address according to the sampling enable signal.

According to an embodiment of the present invention, an operating method of a memory device includes sampling an address as individual first and second addresses respectively according to first and second random signals; and outputting, as a target address for a target refresh operation, the individual first and second addresses respectively according to third and fourth random signals, wherein the sampling includes generating the first random signal according to sub-section signals, which sequentially stay enabled during respective sub-sections within a section, a number of the sub-section signals depending on a number of times that an active signal is enabled during the section, and wherein the outputting includes generating each of the third and fourth random signals based on the first random signal and the sub-section signals.

According to the embodiments of the present invention, the integrated circuit may address periodicity of the sampling circuit and maximize randomization by dividing the sampling period into one or more sub-sections in proportion to the number of inputs of the active signals and performing sampling by varying the number of bits of the random signal for each sub-section. In addition, according to the embodiments of the present invention, the integrated circuit may maximize accuracy of address sampling and improve efficiency of a target refresh operation by applying a sampling circuit to a memory device performing the target refresh operation by sampling addresses based on probability.

DETAILED DESCRIPTION

Figure 1:
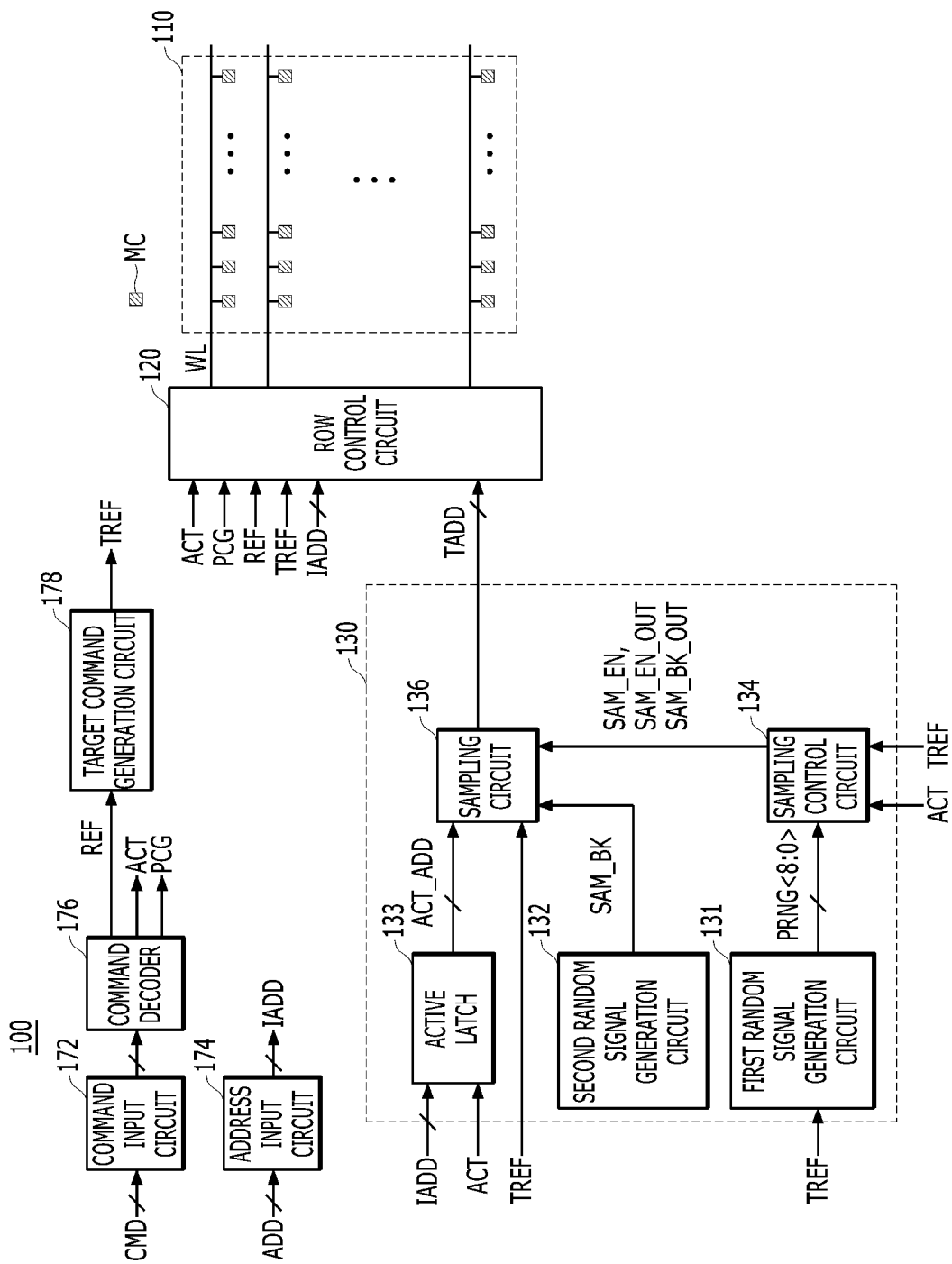
FIG. 1 is a block diagram illustrating a memory device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

Hereinafter, a memory device will be described as an example of an integrated circuit including a sampling circuit. However, the present invention is not limited thereto, and may be applied to all integrated circuits including a sampling circuit for randomly sampling input addresses or signals. In addition, in the following embodiments, a description of a configuration related to a data input/output operation will be omitted to focus on a refresh operation.

FIG. 1 is a block diagram illustrating a memory device 100 in accordance with an embodiment of the present invention.

Referring to FIG. 1, the memory device 100 may include a memory cell array 110, a row control circuit 120, a refresh control circuit 130, a command input circuit 172, an address input circuit 174, a command decoder 176, and a target command generation circuit 178.

The memory cell array 110 may include a plurality of memory cells MC coupled to a plurality of word lines WL and a plurality of bit lines. The memory cell array 110 may include a plurality of banks. The number of banks or the number of memory cells MC may be determined depending on the capacity of the memory device 100.

The command input circuit 172 may receive a command CMD, and the address input circuit 174 may receive an address ADD, from an external device e.g., a memory controller. The address input circuit 174 may receive the address ADD and output an internal input address IADD. Each of the command CMD and the address ADD may include a multi-bit signal. The command decoder 176 may decode the command CMD input through the command input circuit 172 and may generate an active command ACT, a precharge command PCG, and a normal refresh command REF. The command decoder 176 may generate a read command and a write command, as well as other commands, by decoding received commands CMD.

The target command generation circuit 178 may generate a target refresh command TREF based on the normal refresh command REF. For example, the target command generation circuit 178 may generate the target refresh command TREF whenever the number of inputs of the normal refresh command REF reaches a preset number.

The row control circuit 120 may activate a word line corresponding to the internal input address IADD in response to the active command ACT, and may precharge the activated word line in response to the precharge command PCG. In order to select a word line to be refreshed during a normal refresh operation, a refresh counter (not shown) for generating a counting address that is sequentially increasing according to the normal refresh command REF may be additionally provided. The row control circuit 120 may perform the normal refresh operation of sequentially refreshing a plurality of word lines WL corresponding to the counting address according to the normal refresh command REF. The row control circuit 120 may perform a target refresh operation of refreshing one or more neighboring word lines of a word line WL corresponding to a target address TADD according to the target refresh command TREF.

The refresh control circuit 130 may latch the internal input address IADD as an active address ACT_ADD according to the active command ACT. The refresh control circuit 130 may sample the active address ACT_ADD according to a sampling enable signal SAM_EN or a backup random signal SAM_BK, and output the sampled address as the target address TADD according to the target refresh command TREF.

In detail, the refresh control circuit 130 may include a first random signal generation circuit 131, a second random signal generation circuit 132, an active latch 133, a sampling control circuit 134, and a sampling circuit 136.

The first random signal generation circuit 131 may generate a random signal PRNG<8:0> according to the target refresh command TREF. The first random signal generation circuit 131 may change a value of the random signal PRNG<8:0> when the target refresh command TREF is inputted. Preferably, the first random signal generation circuit 131 may be implemented with a pseudo-random number generator (PRNG) based on a linear feedback shift register (LFSR). Hereinafter, a case in which the random signal PRNG<8:0> is formed of random bits of 9 bits will be described as an example. A detailed configuration and operation of the first random signal generation circuit 131 will be described with reference to FIG. 2.

The second random signal generation circuit 132 may generate the backup random signal SAM_BK that is randomly activated. The second random signal generation circuit 132 may generate the backup random signal SAM_BK that is randomly activated in a known manner. The second random signal generation circuit 132 may be implemented as a random pattern generator that generates a random sampling signal, for example, a pseudo-random binary sequence (PRBS) random pattern generator based on LFSR.

The active latch 133 may latch the internal input address IADD as the active address ACT_ADD according to the active command ACT.

The sampling control circuit 134 may generate the sampling enable signal SAM_EN corresponding to the random signal PRNG<8:0> based on the number (referred to as the "input number of active command ACT") of inputs of the active command ACT during a sampling period. For reference, the sampling period may be determined by the target refresh command TREF, and one sampling period may be defined as a target refresh period between adjacent two target refresh commands TREF. According to an embodiment, in the case of an integrated circuit, the target refresh command TREF may be defined as a sampling signal.

The sampling control circuit 134 may generate an active counting signal (ACT_CNT<8:0> of FIG. 3) by counting the number of inputs of the active command ACT during the sampling period, and may divide the sampling period into a plurality of sub-sections according to the active counting signal ACT_CNT<8:0>. In addition, the sampling control circuit 134 may compare the random signal PRNG<8:0> with the active counting signal ACT_CNT<8:0> for each sub-section to generate the sampling enable signal SAM_EN that is randomly activated. The sampling control circuit 134 may adjust the number of sub-sections according to the number of inputs of the active command ACT. For example, the sampling control circuit 134 may increase the number of sub-sections as the active counting signal ACT_CNT<8:0> increases. The sampling control circuit 134 may generate the sampling enable signal SAM_EN by comparing one or more bits of the random signal PRNG<8:0> with one or more bits of the active counting signal ACT_CNT<8:0> during each sub-section, while comparing different numbers of the bits for each sub-section. A detailed configuration and operation of the sampling control circuit 134 will be described with reference to FIGS. 3 to 13.

The sampling circuit 136 may sample and store the active address ACT_ADD according to the sampling enable signal SAM_EN or the backup random signal SAM_BK. The sampling circuit 136 may output the sampled address as the target address TADD according to the target refresh command TREF. Depending on an embodiment, the sampling circuit 136 may calculate one or more adjacent addresses using the sampled addresses, and output the adjacent addresses as the target address TADD.

Furthermore, when the number of inputs of the active command ACT is less than a value specified by the random signal PRNG<8:0>, i.e., when the active counting signal ACT_CNT<8:0> is less than the random signal PRNG<8:0>, the sampling enable signal SAM_EN corresponding to the random signal PRNG<8:0> may not be generated. To prepare for such a case, the sampling control circuit 134 according to an embodiment of the present invention may selectively activate a first sampling output signal SAM_EN_OUT or a second sampling output signal SAM_BK_OUT depending on whether the sampling enable signal SAM_EN corresponding to the random signal PRNG<8:0> is generated or not. The sampling circuit 136 may store the active address ACT_ADD according to the sampling enable signal SAM_EN to output the stored address to a common node according to the first sampling output signal SAM_EN_OUT. Alternatively, the sampling circuit 136 may store the active address ACT_ADD according to the backup random signal SAM_BK to output the stored address to the common node according to the second sampling output signal SAM_BK_OUT. Finally, the sampling circuit 136 may output the address at the common node as the target address TADD according to the target refresh command TREF. A detailed configuration and operation of the sampling circuit 136 will be described with reference to FIGS. 14 and 15.

As described above, in an embodiment of the present invention, the random signal PRNG<8:0> is generated based on the target refresh command TREF during the sampling period, and when the number of inputs of the active command ACT reaches the random signal PRNG<8:0>, the active address ACT_ADD provided together with the active command ACT may be stored and used as the target address TADD. Also, in an embodiment of the present invention, to cover the case where the number of inputs of the active command ACT does not reach the random signal PRNG<8:0>, the active address ACT_ADD may be stored and used as the target address TADD using the backup random signal SAM_BK that is randomly activated in a known method. Therefore, during the target refresh operation, the periodicity of the sampling circuit may be improved and the accuracy of address sampling may be maximized to improve the target refresh efficiency.

In particular, in an embodiment of the present invention, the sampling period may be divided into the sub-sections in proportional to the number of inputs of the active command ACT (i.e., the active counting signal ACT_CNT<8:0>), and the sampling enable signal SAM_EN may be generated by comparing the active counting signal ACT_CNT<8:0> with the random signal PRNG<8:0> for each sub-section. At this time, the sampling enable signal SAM_EN may be generated by increasing the number of bits to be compared between the random signal PRNG<8:0> and the active counting signal ACT_CNT<8:0> each time the sub-section increases. Accordingly, the randomization may be maximized by distributing the address selection probability according to the number of inputs of the active command ACT during the sampling period.

Hereinafter, a detailed configuration of the components of FIG. 1 will be described with reference to the drawings.

Figure 2:
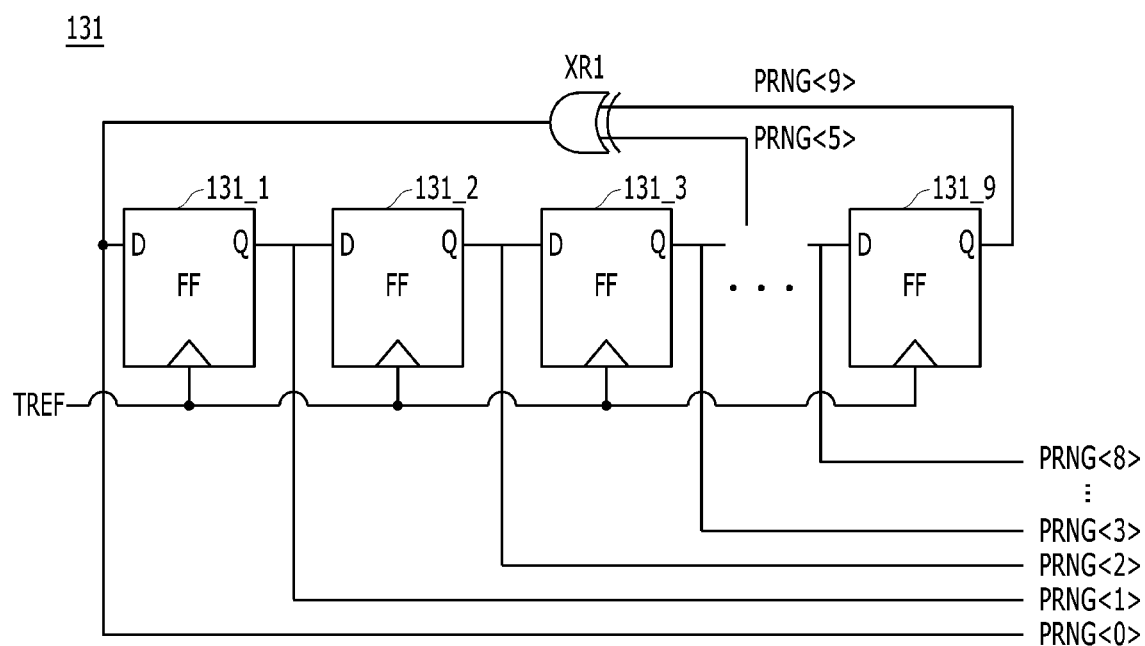
FIG. 2 is a detailed configuration diagram illustrating a first random signal generation circuit shown in FIG. 1 in accordance with an embodiment of the present invention.

FIG. 2 is a detailed configuration diagram illustrating the first random signal generation circuit 131 shown in FIG. 1 in accordance with an embodiment of the present invention.

Referring to FIG. 2, the first random signal generation circuit 131 may be implemented with a linear feedback shift register (LFSR). For example, the first random signal generation circuit 131 may include a plurality of flip-flops 131_1 to 131_9 coupled in series and an XOR gate XR1. For example, to generate the random signal PRNG<8:0> composed of random bits of 9 bits, first to ninth flip-flops 131_1 to 131_9 may be coupled in series. The first to ninth flip-flops 131_1 to 131_9 may receive the target refresh command TREF as a clock signal to transmit a signal of an input terminal (D) to an output terminal (Q). The signals at the input terminals (D) of the first to ninth flip-flops 131_1 to 131_9 may be outputted as first to ninth random bits of the random signal PRNG<8:0>, respectively. A signal from the output terminal (Q) of any (e.g., the fifth flip-flop 131_5) of the first to eighth flip-flops 131_1 to 131_8, and a signal from the output terminal (Q) of the ninth flip-flop 131_9 may be provided to inputs of the XOR gate XR1. For example, and the sixth random bit PRNG<5> and a tenth random bit PRNG<9> may be provided to the inputs of the XOR gate XR1. An output of the XOR gate XR1 may be provided to the input terminal (D) of the first flip-flop 131_1.

With the above configuration, the first random signal generation circuit 131 may change and output the value of the random signal PRNG<8:0> each time the target refresh command TREF is inputted.

Figure 3:
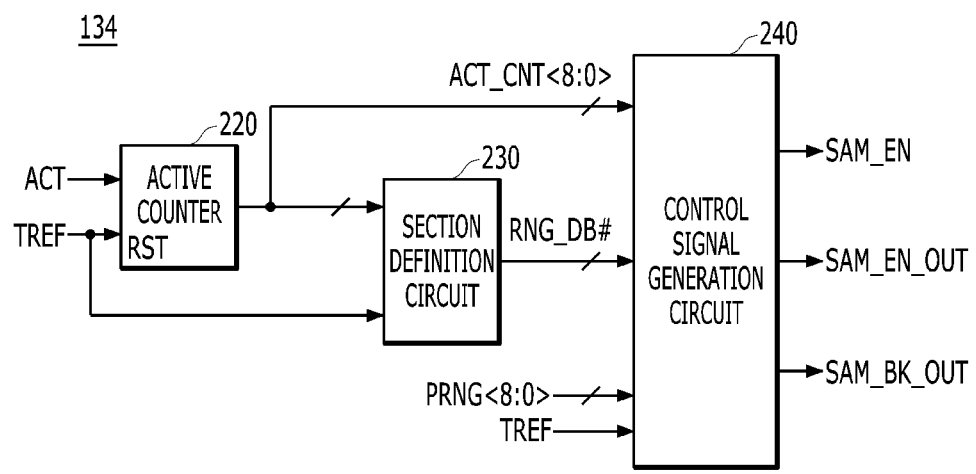
FIG. 3 is a detailed block diagram illustrating a sampling control circuit shown in FIG. 1 in accordance with an embodiment of the present invention.
Figure 4:
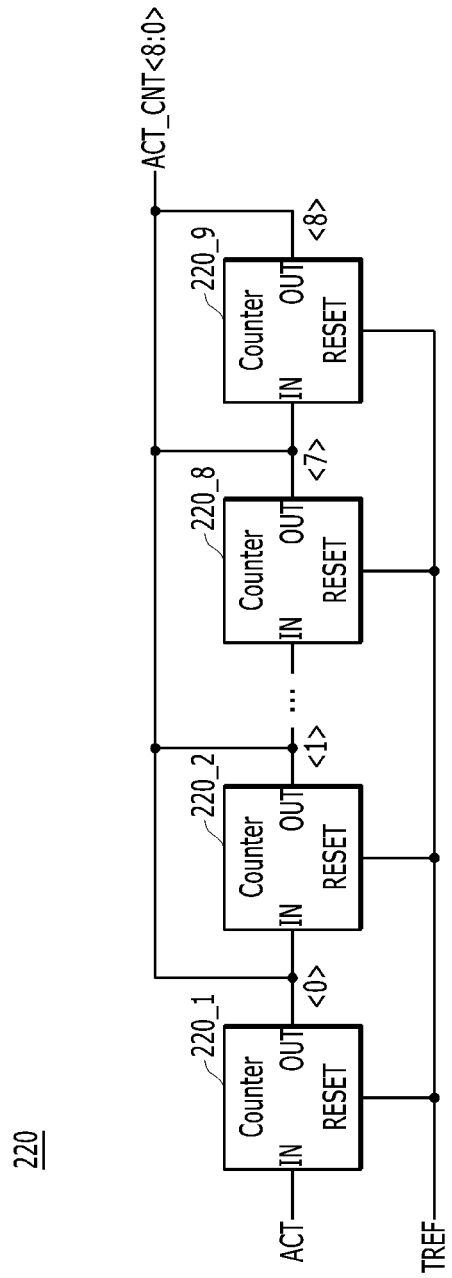
FIG. 4 is a detailed configuration diagram illustrating an active counter shown in FIG. 3 in accordance with an embodiment of the present invention.

FIG. 3 is a detailed block diagram illustrating the sampling control circuit 134 shown in FIG. 1 in accordance with an embodiment of the present invention. FIG. 4 is a detailed configuration diagram illustrating an active counter 220 shown in FIG. 3 in accordance with an embodiment of the present invention.

Referring to FIG. 3, the sampling control circuit 134 may include the active counter 220, a section definition circuit 230, and a control signal generation circuit 240.

The active counter 220 may generate the active counting signal ACT_CNT<8:0> by counting the number of inputs of the active command ACT during the sampling period. The active counter 220 may be reset in response to the target refresh command TREF, and generate the active counting signal ACT_CNT<8:0> that has a value increasing by "+1" when the active command ACT is inputted. Preferably, the active counter 220 may increase the value of the active counting signal ACT_CNT<8:0> by "+1" in response to a falling edge of the active command ACT. For example, referring to FIG. 4, to generate the active counting signal ACT_CNT<8:0> consisting of active counting bits of 9 bits, first to ninth unit counters 220_1 to 220_9 may be coupled in series. The target refresh command TREF may be provided to a reset terminal (RESET) of each of the first to ninth unit counters 220_1 to 220_9, the active command ACT may be provided to an input terminal (IN) of the first unit counter 220_1, and the active counting bits of the active counting signal ACT_CNT<8:0> may be outputted from output terminals (OUT) of the first to ninth unit counters 220_1 to 220_9, respectively.

The section definition circuit 230 may divide the sampling period into the sub-sections according to the active counting signal ACT_CNT<8:0> and generate a plurality of section definition signals RNG_DB # corresponding to each of the plurality of sub-sections. The section definition circuit 230 may activate the first section definition signal RNG_DB0 corresponding to the first sub-section according to the target refresh command TREF. Subsequently, the section definition circuit 230 may sequentially activate the second to ninth section definition signals RNG_DB1 to RNG_DB8 as second to ninth active counting bits ACT_CNT<8:1> of the active counting signal ACT_CNT<8:0>, except for the least significant bit (LSB) (i.e., the first active counting bit ACT_CNT<0>), to become sequentially high bits. The section definition signals RNG_DB # may be configured as a number (i.e., 9 bits) corresponding to the maximum number of active counting bits (i.e., # is a number from 0 to 8). A detailed configuration and operation of the section definition circuit 230 will be described with reference to FIGS. 5 to 8.

The control signal generation circuit 240 may generate the sampling enable signal SAM_EN by comparing the random bits included in the random signal PRNG<8:0> with the active counting bits included in the active counting signal ACT_CNT<8:0> according to the section definition signals RNG_DB #. The control signal generation circuit 240 may sequentially increase the number of compared random bits and active counting bits each time the section definition signals RNG_DB # are sequentially activated. For example, the control signal generation circuit 240 may compare the first random bit PRNG<0> with the first active counting bit ACT_CNT<0> according to the first section definition signal RNG_DB0, and activate the sampling enable signal SAM_EN when the comparison result matches. The control signal generation circuit 240 may respectively compare the first and second random bits PRNG<1:0> with the first and second active counting bit ACT_CNT<1:0>, according to the second section definition signal RNG_DB1, and activate the sampling enable signal SAM_EN when the comparison result matches.

In addition, the control signal generation circuit 240 may selectively activate the first sampling output signal SAM_EN_OUT or the second sampling output signal SAM_BK_OUT by determining whether the sampling enable signal SAM_EN corresponding to the random signal PRNG<8:0> has been generated. For example, if it is determined that the sampling enable signal SAM_EN corresponding to the random signal PRNG<8:0> is generated, the control signal generation circuit 240 may activate the first sampling output signal SAM_EN_OUT. A detailed configuration and operation of the control signal generation circuit 240 will be described with reference to FIGS. 9 to 13.

In the following embodiment, a case where the section definition signals RNG_DB # are activated to a logic low level, and the first sampling output signal SAM_EN_OUT and the second sampling output signal SAM_BK_OUT are activated to a logic high level, will be described as an example.

Figure 5:
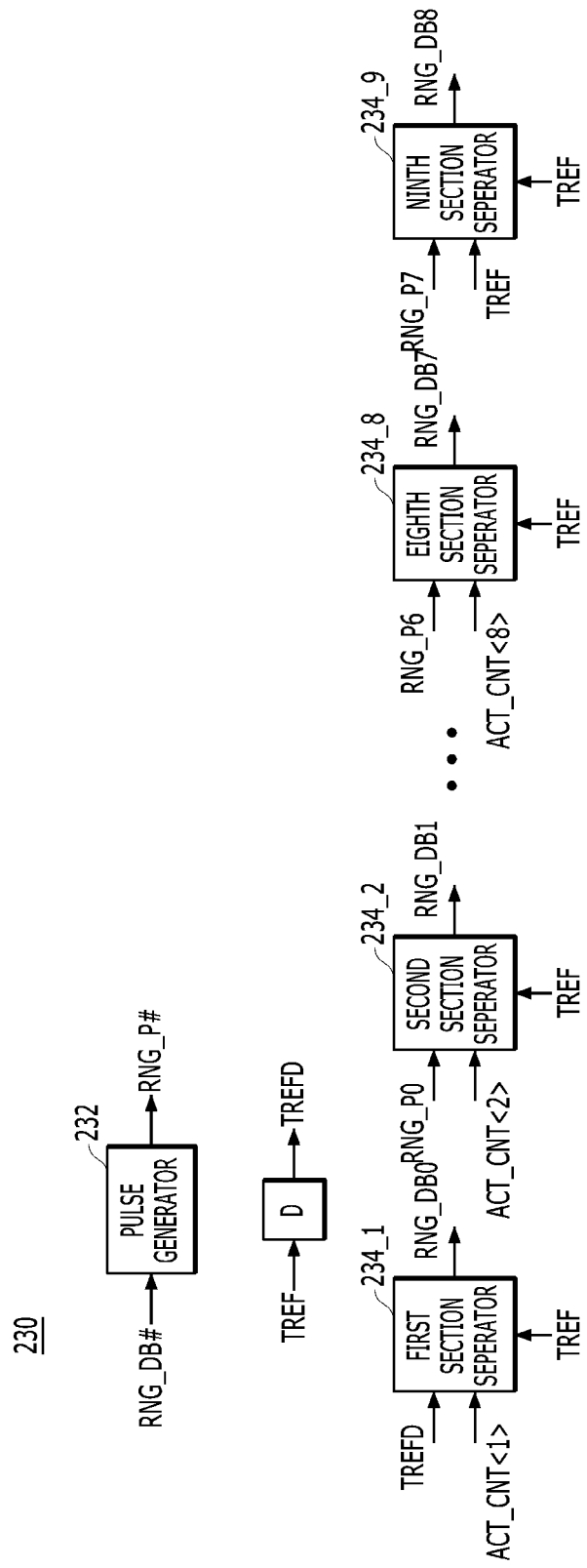
FIG. 5 is a detailed configuration diagram illustrating a section definition circuit shown in FIG. 3 in accordance with an embodiment of the present invention.
Figure 6:
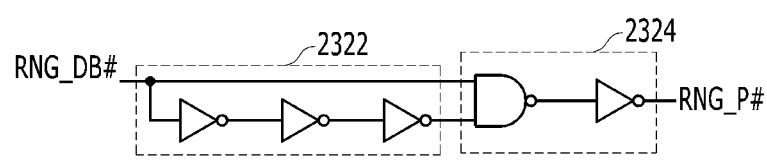
FIG. 6 is a detailed circuit diagram illustrating a pulse generator shown in FIG. 5 in accordance with an embodiment of the present invention.
Figure 7:
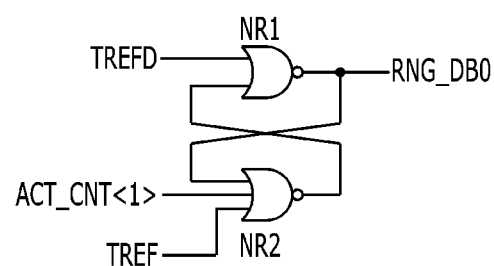
FIG. 7 is a detailed circuit diagram illustrating a first section separator shown in FIG. 5 in accordance with an embodiment of the present invention.

FIG. 5 is a detailed configuration diagram illustrating the section definition circuit 230 shown in FIG. 3 in accordance with an embodiment of the present invention. FIG. 6 is a detailed circuit diagram illustrating a pulse generator 232 shown in FIG. 5 in accordance with an embodiment of the present invention. FIG. 7 is a detailed circuit diagram illustrating a first section separator 234_1 shown in FIG. 5 in accordance with an embodiment of the present invention.

Referring to FIG. 5, the section definition circuit 230 may include the pulse generator 232, a delay D, and a plurality of section separators 234_1 to 234_9.

The pulse generator 232 may generate a plurality of section definition pulses RNG_P # respectively corresponding to the section definition signals RNG_DB #. Each of the section definition pulses RNG_P # may pulse a certain period at an end of an activation section of each of the section definition signals RNG_DB #. The pulse generator 232 may be provided in a number corresponding to each of the section definition signals RNG_DB #. Referring to FIG. 6, the pulse generator 232 may include a delay part 2322 composed of odd numbers of inverters, and a signal combination part 2324. The delay part 2322 may invert and delay the section definition signals RNG_DB #, and the signal combination part 2324 may perform a logic AND operation on an output of the delay part 2322 and the section definition signals RNG_DB # to output the section definition pulses RNG_P #. Accordingly, the pulse generator 232 may generate the section definition pulses RNG_P #, each pulsing when the section definition signals RNG_DB # are deactivated from a logic low level to a logic high level (i.e., a rising edge of the section definition signals RNG_DB #).

The delay D may generate a delayed target refresh command TREFD by delaying the target refresh command TREF by a predetermined delay time.

The section definition circuit 230 may include first to ninth section separators 234_1 to 234_9 coupled in series. The first to ninth section separators 234_1 to 234_9 may sequentially output the first to ninth section definition signals RNG_DB0 to RNG_DB8 according to the delayed target refresh command TREFD, while adjusting the number of sub-sections according to the active counting bits and activating the section definition signals corresponding to the sub-sections. The first section separator 234_1 may generate the first section definition signal RNG_DB0 that is set (i.e., activated) to a logic low level according to the delayed target refresh command TREF, and reset (i.e., deactivate) to a logic high level according to the target refresh command TREF or the second active counting bit ACT_CNT<1>. The second to eighth section separators 234_2 to 234_8 may generate the second to eighth definition signals RNG_DB1 to RNG_DB7 that are set according to outputs of section separators at previous stages, and reset according to the target refresh command TREF or the third to ninth active counting bits ACT_CNT<8:2>. The ninth section separator 234_9 may generate the ninth section definition signal RNG_DB8 that is set according to an output of a section separator at a previous stage, and reset according to the target refresh command TREF.

To secure the timing margin, the second to ninth section separators 234_2 to 234_9 may receive the first to eighth section definition pulses RNG_P0 to RNG_P7 provided from the pulse generator 232, instead of the first to eighth section definition signals RNG_DB0 to RNG_DB7 provided from the previous section separators. However, the present invention is not limited thereto, and the first to ninth section separators 234_1 to 234_9 may directly receive section definition signals or may receive modified signals corresponding thereto.

Each of the first to ninth section separators 234_1 to 234_9 may have substantially the same configuration. Referring to FIG. 7, the first section separator 234_1 may be implemented with an SR latch composed of two cross-coupled NOR gates. The SR latch may receive the delayed target refresh command TREFD as a set signal, and receive the second active counting bit ACT_CNT<1> or the target refresh command TREF as a reset signal, to output the first section definition signal RNG_DB0.

Figure 8:
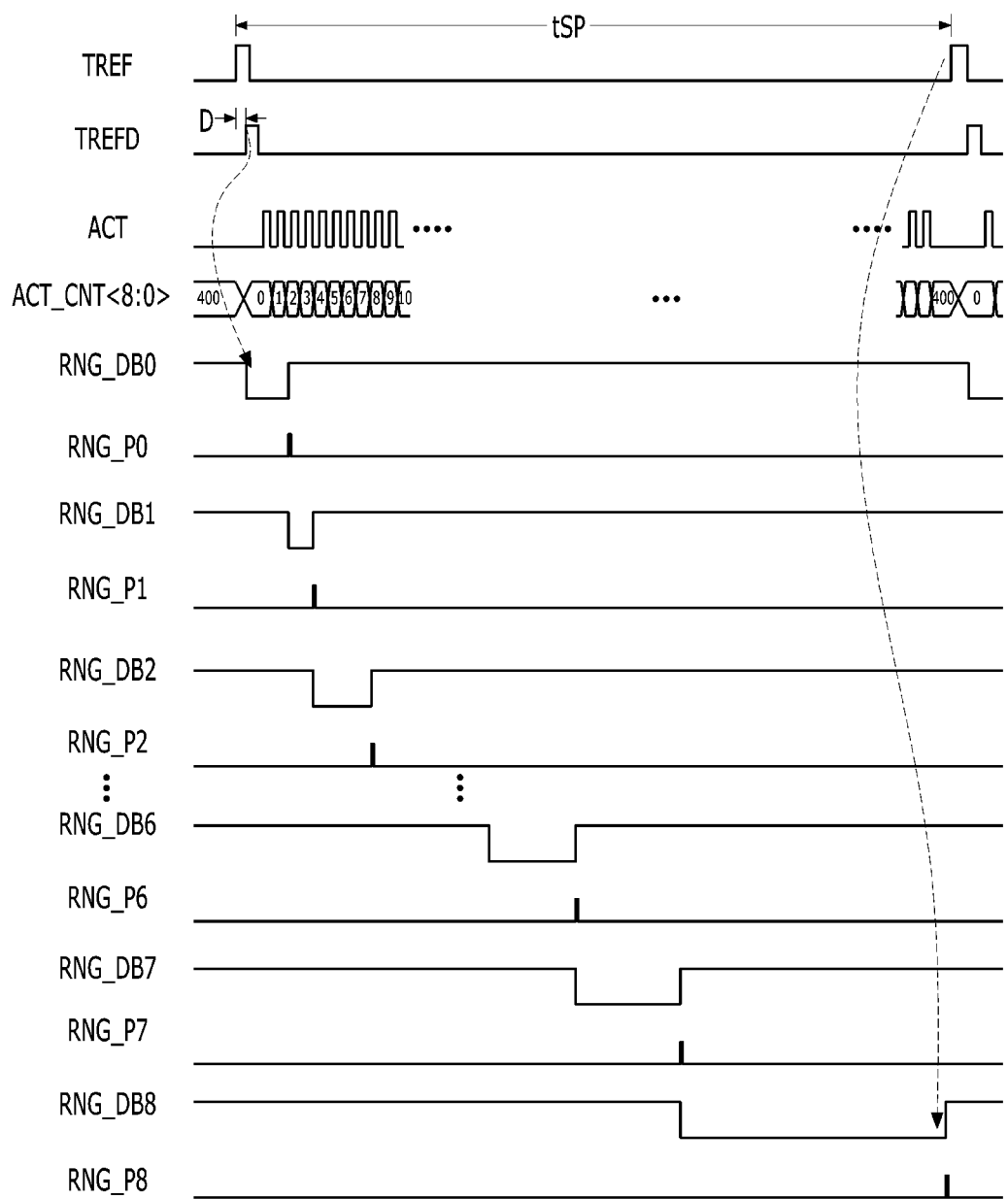
FIG. 8 is a waveform diagram for describing an operation of the section definition circuit shown in FIG. 5 in accordance with an embodiment of the present invention.

FIG. 8 is a waveform diagram for describing an operation of the section definition circuit 230 shown in FIG. 5 in accordance with an embodiment of the present invention.

Referring to FIG. 5, a case where 400 active commands ACT are inputted during the sampling period tSP defined by the target refresh command TREF, is illustrated.

The active counter 220 may increase the value of the active counting signal ACT_CNT<8:0> by "+1" each time the active command ACT is inputted during the sampling period tSP. As shown in Table 1, the active counter 220 may generate the active counting signal ACT_CNT<8:0> that increases according to the number of inputs of the active command ACT. In this case, the active counting bits may be sequentially activated to the high bits whenever the number of inputs of the active command ACT reaches 2^m (m is an integer from 0 to 8).

TABLE 1

| input number of ACT | ACT_CNT<8:0> |
| --- | --- |
| 1 | 0 0000 0001 |
| 2 | 0 0000 0010 |
| 4 | 0 0000 0100 |
| 8 | 0 0000 1000 |
| 16 | 0 0001 0000 |
| 32 | 0 0010 0000 |
| 64 | 0 0100 0000 |
| 128 | 0 1000 0000 |
| 256 | 1 0000 0000 |
| 400 | 1 1001 0000 |

The first to ninth section separators 234_1 to 234_9 may reset the first to ninth section definition signals RNG_DB0 to RNG_DB8 to a logic high level according to the target refresh command TREF. After the predetermined delay time of the delay D, the first section separator 234_1 may distinguish the first sub-section by activating the first section definition signal RNG_DB0 to a logic low level according to the delayed target refresh command TREFD.

As the active command ACT is inputted twice, the second active counting bit ACT_CNT<1> becomes a high bit, the first section separator 234_1 may deactivate the first section definition signal RNG_DB0 to a logic high level, and the pulse generator 232 may generate the first section definition pulse RNG_P0. Accordingly, the second section separator 234_2 may activate the second section definition signal RNG_DB1 to a logic low level.

As the active command ACT is inputted four times, the third active counting bit ACT_CNT<2> becomes a high bit, the second section separator 234_2 may deactivate the second section definition signal RNG_DB1 to a logic high level, and the pulse generator 232 may generate the second section definition pulse RNG_P1. Accordingly, the third section separator 234_3 may activate the third section definition signal RNG_DB2 to a logic low level.

In this way, as the active command ACT is inputted 256 times, the ninth active counting bit ACT_CNT<8> becomes a high bit, the eighth section separator 234_8 may deactivate the eighth section definition signal RNG_DB7 to a logic high level, and the pulse generator 232 may generate the eighth section definition pulse PNG_P7. Accordingly, the ninth section separator 234_9 may activate the ninth section definition signal RNG_DB8 to a logic low level. Thereafter, the first to ninth section separators 234_1 to 234_9 may reset the first to ninth section definition signals RNG_DB0 to RNG_DB8 to a logic high level according to the target refresh command TREF.

Figure 9:
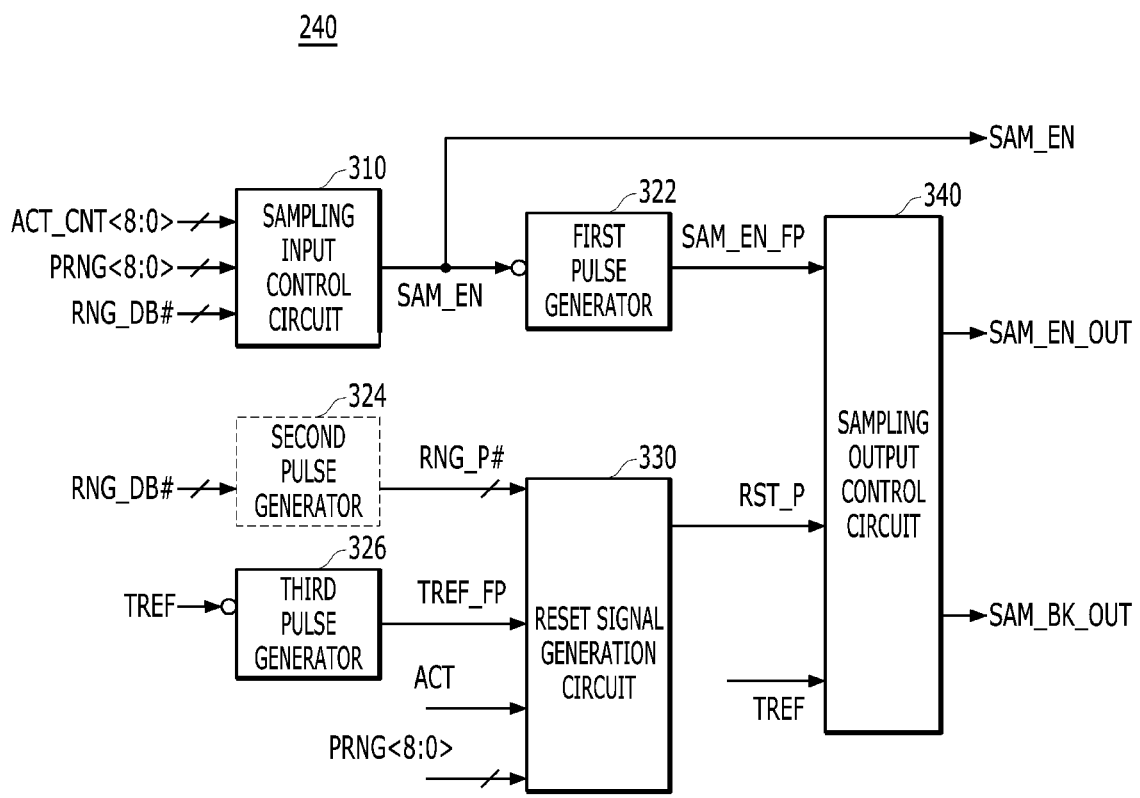
FIG. 9 is a detailed configuration diagram illustrating a control signal generation circuit shown in FIG. 3 in accordance with an embodiment of the present invention.

FIG. 9 is a detailed configuration diagram illustrating the control signal generation circuit 240 shown in FIG. 3 in accordance with an embodiment of the present invention.

Referring to FIG. 9, the control signal generation circuit 240 may include a sampling input control circuit 310, a first pulse generator 322, a second pulse generator 324, a third pulse generator 326, a reset signal generation circuit 330, and a sampling output control circuit 340.

The sampling input control circuit 310 may generate the sampling enable signal SAM_EN by comparing different random bits and active counting bits according to the section definition signals RNG_DB #. The sampling input control circuit 310 may sequentially increase the number of compared random bits and active counting bits each time the section definition signals RNG_DB # is sequentially activated. For example, the sampling input control circuit 310 may compare the first random bit PRNG<0> with the first active counting bit ACT_CNT<0> according to the first section definition signal RNG_DB0, and activate the sampling enable signal SAM_EN if matched. The sampling input control circuit 310 may respectively compare the first and second random bits PRNG<1:0> with the first and second active counting bit ACT_CNT<1:0>, according to the second section definition signal RNG_DB1, and activate the sampling enable signal SAM_EN if matched. A detailed configuration and operation of the sampling input control circuit 310 will be described with reference to FIG. 10.

The first pulse generator 322 may generate a sampling enable pulse SAM_EN_FP that pulses for a certain period according to an end of an activation section of the sampling enable signal SAM_EN. The first pulse generator 322 may generate the sampling enable pulse SAM_EN_FP that pulses when the sampling enable signal SAM_EN transitions from a logic high level to a logic low level (i.e., at a falling edge of the sampling enable signal SAM_EN). The first pulse generator 322 may have substantially the same configuration as the pulse generator 232 of FIG. 6, except that an inversion signal of the sampling enable signal SAM_EN is inputted.

The second pulse generator 324 may generate the section definition pulse RNG_P #, each pulsing a predetermined period at the end of the activation section of the section definition signals RNG_DB #. The second pulse generator 324 may have substantially the same configuration as the pulse generator 232 of FIG. 6. Depending on the embodiment, the second pulse generator 324 is omitted, and the control signal generation circuit 240 may receive a section definition pulse RNG_P # from the section definition circuit 230.

The third pulse generator 326 may generate a target refresh pulse TREF_FP that pulses for a predetermined period according to the target refresh command TREF. The third pulse generator 326 may generate the target refresh pulse TREF_FP that pulses when the target refresh command TREF transitions from a logic high level to a logic low level (i.e., at a falling edge of the target refresh command TREF). The third pulse generator 326 may have substantially the same configuration as the pulse generator 232 of FIG. 6, except that an inversion signal of the target refresh command TREF is inputted.

The reset signal generation circuit 330 may output a high bit among the random bits of the random signal PRNG<8:0> as a reset signal RST_P according to the section definition pulses RNG_P #. According to an embodiment, the reset signal generation circuit 330 may output the high bit among the random bits by synchronizing it with the active command ACT. In addition, the reset signal generation circuit 330 may activate the reset signal RST_P according to the target refresh pulse TREF_FP. That is, the reset signal generation circuit 330 may activate the reset signal RST_P in response to the falling edge of the target refresh command TREF. A detailed configuration and operation of the reset signal generation circuit 330 will be described with reference to FIGS. 11 and 12.

The sampling output control circuit 340 may generate a first preliminary output signal (PRE_OUT1 of FIG. 13) and a second preliminary output signal (PRE_OUT2 of FIG. 13) according to the sampling enable pulse SAM_EN_FP and the reset signal RST_P. The sampling output control circuit 340 may output the first preliminary output signal PRE_OUT1 as the first sampling output signal SAM_EN_OUT, or the second preliminary output signal PRE_OUT2 as the second sampling output signal SAM_BK_OUT, in synchronization with the target refresh command TREF. A detailed configuration and operation of the sampling output control circuit 340 will be described with reference to FIG. 13.

Figure 10:
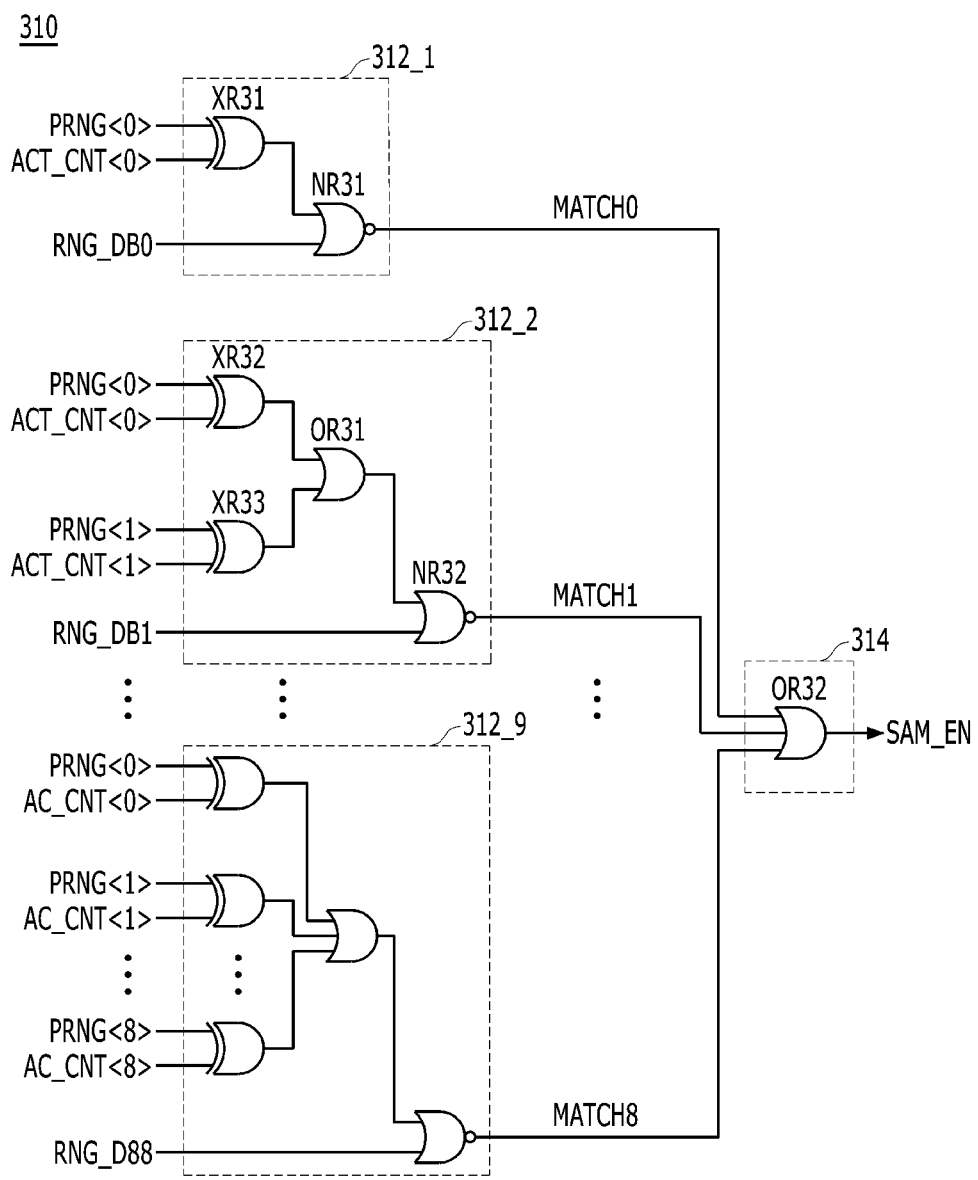
FIG. 10 is a detailed circuit diagram illustrating a sampling input control circuit shown in FIG. 9 in accordance with an embodiment of the present invention.

FIG. 10 is a detailed circuit diagram illustrating the sampling input control circuit 310 shown in FIG. 9 in accordance with an embodiment of the present invention.

Referring to FIG. 10, the sampling input control circuit 310 may include first to ninth comparators 312_1 to 312_9, and a sampling outputter 314.

Each of the first to ninth comparators 312_1 to 312_9 may generate a corresponding one of first to ninth match signals MATCH0 to MATCH8 by comparing the random bits and the active counting bits more than a comparator at a previous stage, according to a corresponding one of the first to ninth section definition signals RNG_DB0 to RNG_DB8.

In detail, the first comparator 312_1 may generate the first match signal MATCH0 by comparing the first random bit PRNG<0> and the first active counting bit ACT_CNT<0> according to the first section definition signal RNG_DB0. For example, the first comparator 312_1 may include a first XOR gate XR31 and a first NOR gate NR31. The first XOR gate XR31 may perform a logic XOR operation on the first random bit PRNG<0> and the first active counting bit ACT_CNT<0>. The first NOR gate NR31 may perform a logic NOR operation on an output of the first XOR gate XR31 and the first section definition signal RNG_DB0 to output the first match signal MATCH0. With the above configuration, the first comparator 312_1 may generate the first match signal MATCH0 activated to a logic high level when the first random bit PRNG<0> and the first active counting bit ACT_CNT<0> are bits at the same level in a state where the first section definition signal RNG_DB0 is activated to a logic low level.

The second comparator 312_2 may generate the second match signal MATCH1 by comparing the first and second random bits PRNG<1:0> and the first and second active counting bits ACT_CNT<1:0> according to the second section definition signal RNG_DB1. For example, the second comparator 312_2 may include second and third XOR gates XR32 and XR33, a first OR gate OR31, and a second NOR gate NR32. The second XOR gate XR32 may perform a logic XOR operation on the first random bit PRNG<0> and the first active counting bit ACT_CNT<0>. The third XOR gate XR33 may perform a logic XOR operation on the second random bit PRNG<1> and the second active counting bit ACT_CNT<1>. The first OR gate may perform a logic OR operation on outputs of the second and third XOR gates XR32 and XR33. The second NOR gate NR32 may perform a logic NOR operation on an output of the first OR gate OR31 and the second section definition signal RNG_DB1 to output the second match signal MATCH1. With the above configuration, the second comparator 312_2 may generate the first match signal MATCH0 activated to a logic high level when the first and second random bits PRNG<1:0> have respectively the same level as the first and second active counting bits ACT_CNT<1:0> in a state where the second section definition signal RNG_DB1 is activated to a logic low level.

Similarly, the ninth comparator 312_9 may generate the ninth match signal MATCH8 by comparing the first to ninth random bits PRNG<8:0> and the first to ninth active counting bits ACT_CNT<8:0> according to the ninth section definition signal RNG_DB8. That is, the ninth comparator 312_9 may generate the ninth match signal MATCH8 activated to a logic high level when the first to ninth random bits PRNG<8:0> have respectively the same level as the first to ninth active counting bits ACT_CNT<8:0> in a state where the ninth section definition signal RNG_DB8 is activated.

The sampling outputter 314 may generate the sampling enable signal SAM_EN when any of the first to ninth match signals MATCH0 to MATCH8 is activated. For example, the sampling outputter 314 may be implemented with an OR gate OR32 that outputs the sampling enable signal SAM_EN by performing a logic OR operation on the first to ninth match signals MATCH0 to MATCH8.

Figure 11:
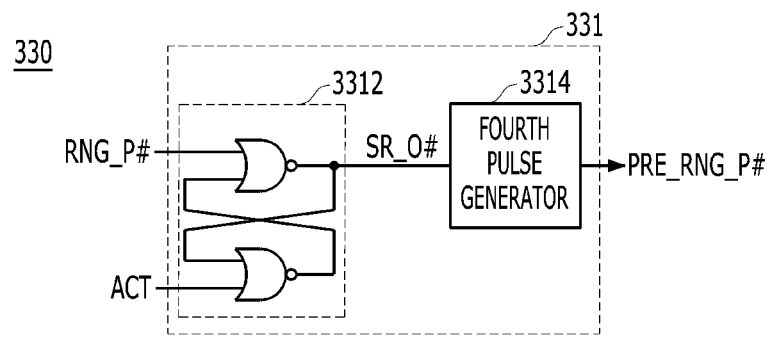
FIG. 11 is a detailed circuit diagram illustrating a reset signal generation circuit shown in FIG. 9 in accordance with an embodiment of the present invention.
Figure 11:
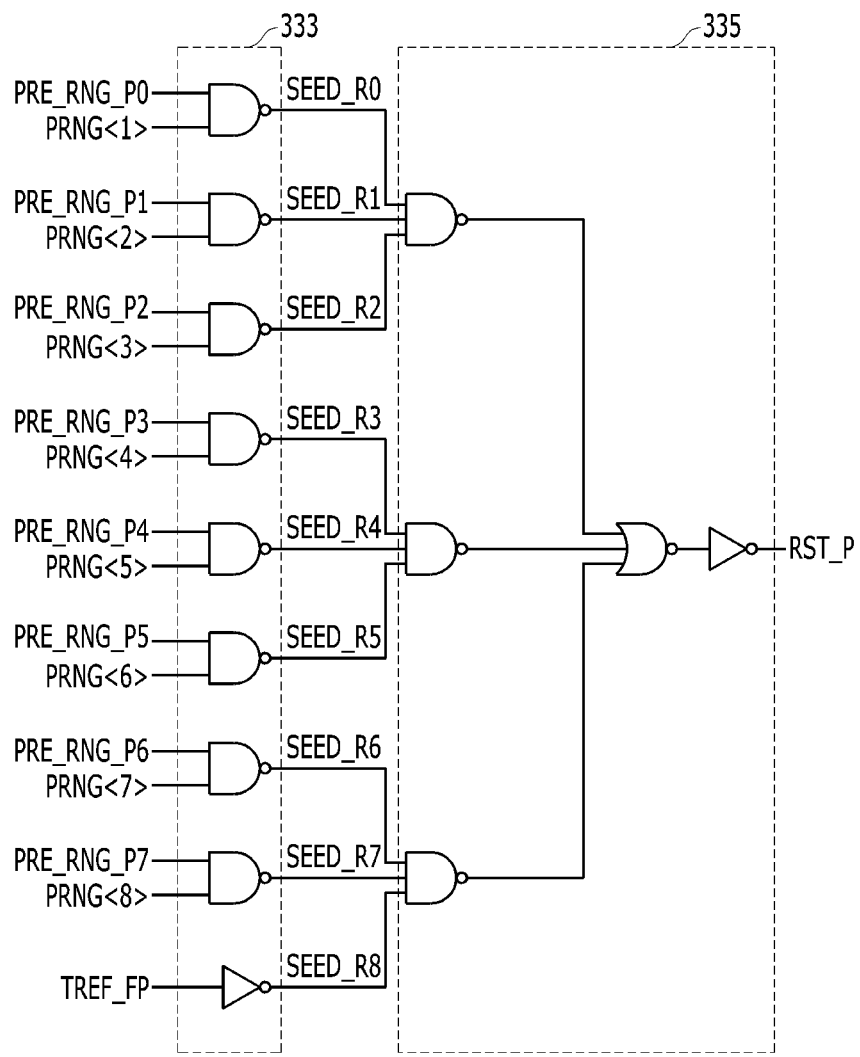

FIG. 11 is a detailed circuit diagram illustrating the reset signal generation circuit 330 shown in FIG. 9 in accordance with an embodiment of the present invention.

Referring to FIG. 11, the reset signal generation circuit 330 may include a synchronization signal generation part 331, a high-bit detection part 333, and a reset output part 335.

The synchronization signal generation part 331 may output a plurality of synchronization pulses PRE_RNG_P # generated according to the section definition pulses RNG_P # in synchronization with the active command ACT.

For example, the synchronization signal generation part 331 may include a synchronizer 3312 and a fourth pulse generator 3314. The synchronizer 3312 may generate a plurality of preliminary synchronization signals SR_0 # that are set to a logic low level in response to the section definition pulses RNG_P # and reset to a logic high level in response to the active command ACT. Depending on an embodiment, an active pulse that is pulsed when the active command ACT transitions from a logic low level to a logic high level (i.e., at a rising edge of the active command ACT) may be used as a reset signal. The synchronizer 3312 may be provided in a number corresponding to the section definition pulses RNG_P #, and the preliminary-synchronization signals SR_0 # may respectively correspond to the section definition pulses RNG_P #. The synchronizer 3312 may be implemented with an SR latch composed of two cross-coupled NOR gates. The fourth pulse generator 3314 may generate the synchronization pulses PRE_RNG_P # that pulse for a predetermined period at a rising edge of the preliminary synchronous signals SR_0 #. The fourth pulse generator 3314 may have substantially the same configuration as the pulse generator 232 of FIG. 6.

The high-bit detection part 333 may output first to eighth seed reset signals SEED_R0 to SEED_R7 according to a high bit of the second to ninth random bits PRNG<8:1> by synchronizing the high bit with the first to eighth synchronization pulses PRE_RNG_P0 to PRE_RNG_P7. For example, the high-bit detection part 333 may activate and output the second seed reset signal SEED_R1 to a logic low level when the second synchronization pulse PRE_RNG_P1 pulses by a logic high level in case where the third random bit PRNG<2> is the high bit. In addition, the high-bit detection part 333 may output a ninth seed reset signal SEED_R8 to a logic low level when the target refresh pulse TREF_FP pulses by a logic high level. The high-bit detection part 333 may be implemented with a plurality of NAND gates and inverters.

The reset output part 335 may generate a reset signal RST_P that is activated to a logic high level when any of the first to ninth seed reset signals SEED_R0 to SEED_R8 is activated to a logic low level. For example, the reset output part 335 may be implemented with a plurality of NAND gates, a NOR gate and an inverter for performing an OR operation on the first to ninth seed reset signals SEED_R0 to SEED_R8 to output the reset signal RST_P.

Figure 12:
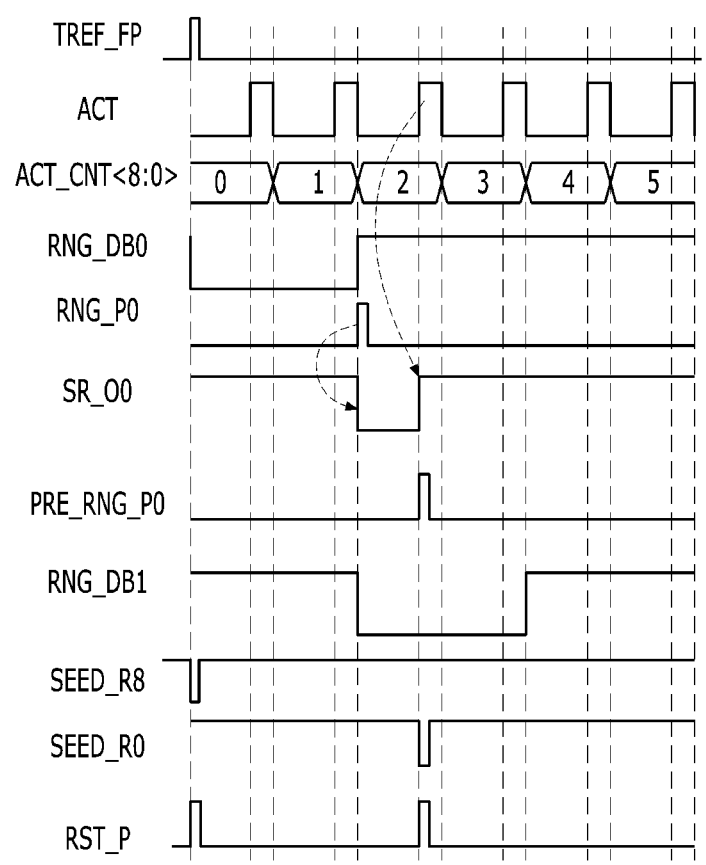
FIG. 12 is a waveform diagram for describing an operation of the reset signal generation circuit shown in FIG. 11 in accordance with an embodiment of the present invention.

FIG. 12 is a waveform diagram for describing an operation of the reset signal generation circuit 330 shown in FIG. 11 in accordance with an embodiment of the present invention.

Referring to FIG. 12, a case in which the second random bit PRNG<1> is set to a high bit is illustrated.

First, when the target refresh pulse TREF_FP pulses by a logic high level, the high-bit detection part 333 may output the ninth seed reset signal SEED_R8 activated to a logic low level. Accordingly, the reset output part 335 may activate the reset signal RST_P to a logic high level.

Thereafter, as the active command ACT is inputted twice, the first section definition signal RNG_DB0 is deactivated to a logic high level, and the first section definition pulse RNG_P0 pulses a certain period. The synchronization signal generation part 331 may set the first preliminary synchronization signal SR_00 to a logic low level according to the first section definition pulse RNG_P0.

Thereafter, as the active command ACT is inputted three times, the synchronization signal generation part 331 may reset the first preliminary-synchronization signal SR_00 to a logic high level, and the fourth pulse generator 3314 may generate the first synchronization pulse PRE_RNG_P0 pulsing a predetermined period at the rising edge of the first preliminary synchronous signals SR_00. When the second random bit PRNG<1> is a high bit, the high-bit detection part 333 may output the first seed reset signal SEED_R0 activated to a logic low level in response to the first synchronization pulse PRE_RNG_P0 pulsing by a logic high level. Accordingly, the reset output part 335 may activate the reset signal RST_P activated to a logic high level.

Figure 13:
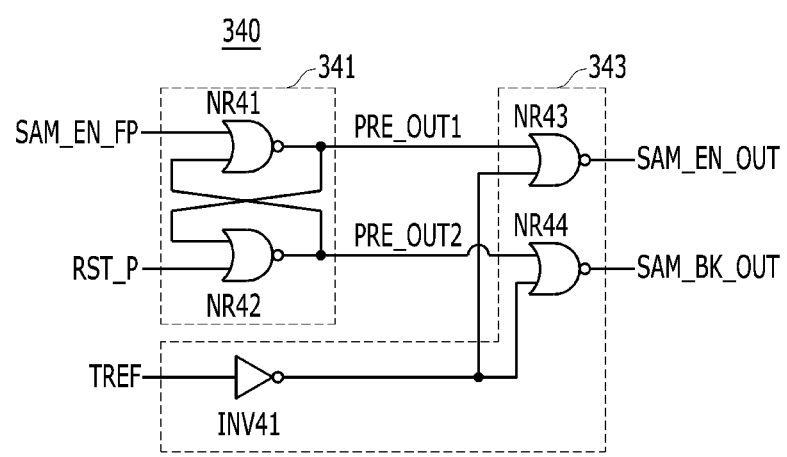
FIG. 13 is a detailed circuit diagram illustrating a sampling output control circuit shown in FIG. 9 in accordance with an embodiment of the present invention.

FIG. 13 is a detailed circuit diagram illustrating the sampling output control circuit 340 shown in FIG. 9 in accordance with an embodiment of the present invention.

Referring to FIG. 13, the sampling output control circuit 340 may include a sampling decision part 341 and an output control part 343.

The sampling decision part 341 may generate the first preliminary output signal PRE_OUT1 that is set to a logic low level in response to the sampling enable pulse SAM_EN_FP and reset to a logic high level in response to the reset signal RST_P. The sampling decision part 341 may generate the second preliminary output signal PRE_OUT2 that is set to a logic low level in response to the reset signal RST_P and is reset to a logic high level in response to the sampling enable pulse SAM_EN_FP. The sampling decision part 341 may be implemented with an SR latch composed of first and second NOR gates NR41 and NR42 that are cross-coupled.

The output control part 343 may output the first preliminary output signal PRE_OUT1 as the first sampling output signal SAM_EN_OUT and the second preliminary output signal PRE_OUT2 as the second sampling output signal SAM_BK_OUT, according to the target refresh command TREF. When the target refresh command TREF is not inputted, the output control part 343 may mask both the first sampling output signal SAM_EN_OUT and the second sampling output signal SAM_BK_OUT to a logic low level. When the target refresh command TREF is inputted, the output control part 343 may output the first sampling output signal SAM_EN_OUT and the second sampling output signal SAM_BK_OUT by inverting the first preliminary output signal PRE_OUT1 and the second preliminary output signal PRE_OUT2, respectively.

For example, the output control part 343 may include an inverter INV41 and third and fourth NOR gates NR43 and NR44. The inverter INV41 may invert the target refresh command TREF. The third NOR gate NR43 may perform a logic NOR operation on an output of the inverter INV41 and the first preliminary output signal PRE_OUT1 to output the first sampling output signal SAM_EN_OUT. The fourth NOR gate NR44 may perform a logic NOR operation on the output of the inverter INV41 and the second preliminary output signal PRE_OUT2 to output the second sampling output signal SAM_BK_OUT.

With the above configuration, the sampling output control circuit 340 may output the first sampling output signal SAM_EN_OUT that pulses by a logic high level in synchronization with the target refresh command TREF, when the sampling enable pulse SAM_EN_FP pulses later than the reset signal RST_P. On the other hand, the sampling output control circuit 340 may output the second sampling output signal SAM_BK_OUT that pulses by a logic high level in synchronization with the target refresh command TREF, when the reset signal RST_P pulses later than the sampling enable pulse SAM_EN_FP.

Figure 14:
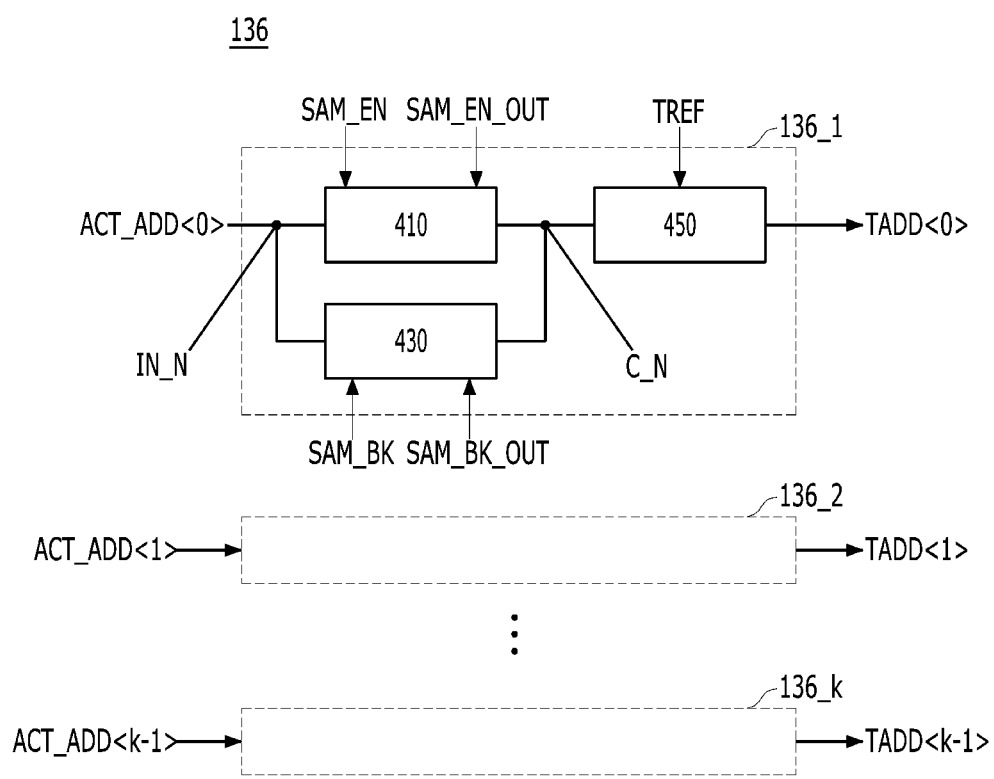
FIG. 14 is a detailed configuration diagram illustrating a sampling circuit shown in FIG. 1 in accordance with an embodiment of the present invention.
Figure 15:
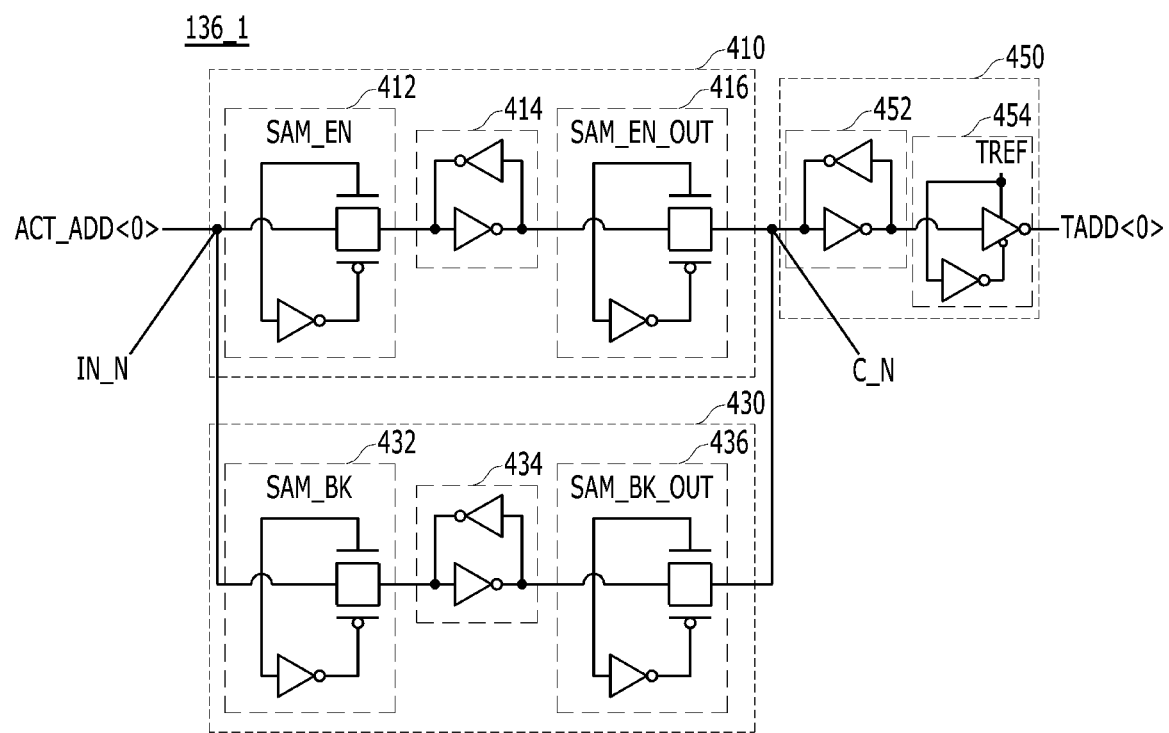
FIG. 15 is a detailed circuit diagram illustrating a first sampling latch circuit shown in FIG. 14 in accordance with an embodiment of the present invention.

FIG. 14 is a detailed configuration diagram illustrating the sampling circuit 136 shown in FIG. 1 in accordance with an embodiment of the present invention. FIG. 15 is a detailed circuit diagram illustrating a first sampling latch circuit 136_1 shown in FIG. 14 in accordance with an embodiment of the present invention.

Referring to FIG. 14, the sampling circuit 136 may include a plurality of unit latch circuits 136_1 to 136_k corresponding to each bit of the active address ACT_ADD<k-1:0>. Each of the unit latch circuits 136_1 to 136_k may include a first input latch 410, a second input latch 430, and an output latch 450. The first input latch 410 and the second input latch 430 may be coupled in parallel between an input node IN_N and a common node C_N. The first input latch 410 may store a corresponding bit in the active address ACT_ADD<k-1:0> according to the sampling enable signal SAM_EN, and output the stored bit to the common node C_N according to the first sampling output signal SAM_EN_OUT. The second input latch 430 may store the corresponding bit according to the backup random signal SAM_BK, and output the stored bit to the common node C_N according to the second sampling output signal SAM_BK_OUT. The output latch 450 may latch a signal at the common node C_N and output the latched signal as a corresponding bit in the target address TADD<k-1:0> according to the target refresh command TREF.

Each of the unit latch circuits 136_1 to 136_k may have substantially the same configuration. Referring to FIG. 15, the first input latch 410 may include a first input transfer part 412, a first latch part 414, and a first output transfer part 416. The first input transfer part 412 may transmit a first bit ACT_ADD<0> of the active address ACT_ADD<k-1:0> to the first latch part 414 according to the sampling enable signal SAM_EN. The first output transfer part 416 may output the first bit ACT_ADD<0> stored in the first latch part 414 to the common node C_N according to the first sampling output signal SAM_EN_OUT.

The second input latch 430 may include a second input transfer part 432, a second latch part 434, and a second output transfer part 436. The second input transfer part 432 may transmit the first bit ACT_ADD<0> to the second latch part 434 according to the backup random signal SAM_BK. The second output transfer part 436 may output the first bit ACT_ADD<0> stored in the second latch part 434 to the common node C_N according to the second sampling output signal SAM_BK_OUT.

The output latch 450 may include a third latch part 452 and a third output transfer part 454. The third latch part 452 may latch the signal at the common node C_N. The third output transfer part 454 may output the bit latched in the third latch part 452 as a first bit TADD<0> of target address TADD<k-1:0>.

Hereinafter, a sampling operation according to an embodiment of the present invention will be described with reference to FIGS. 1 to 17.

Figure 16:
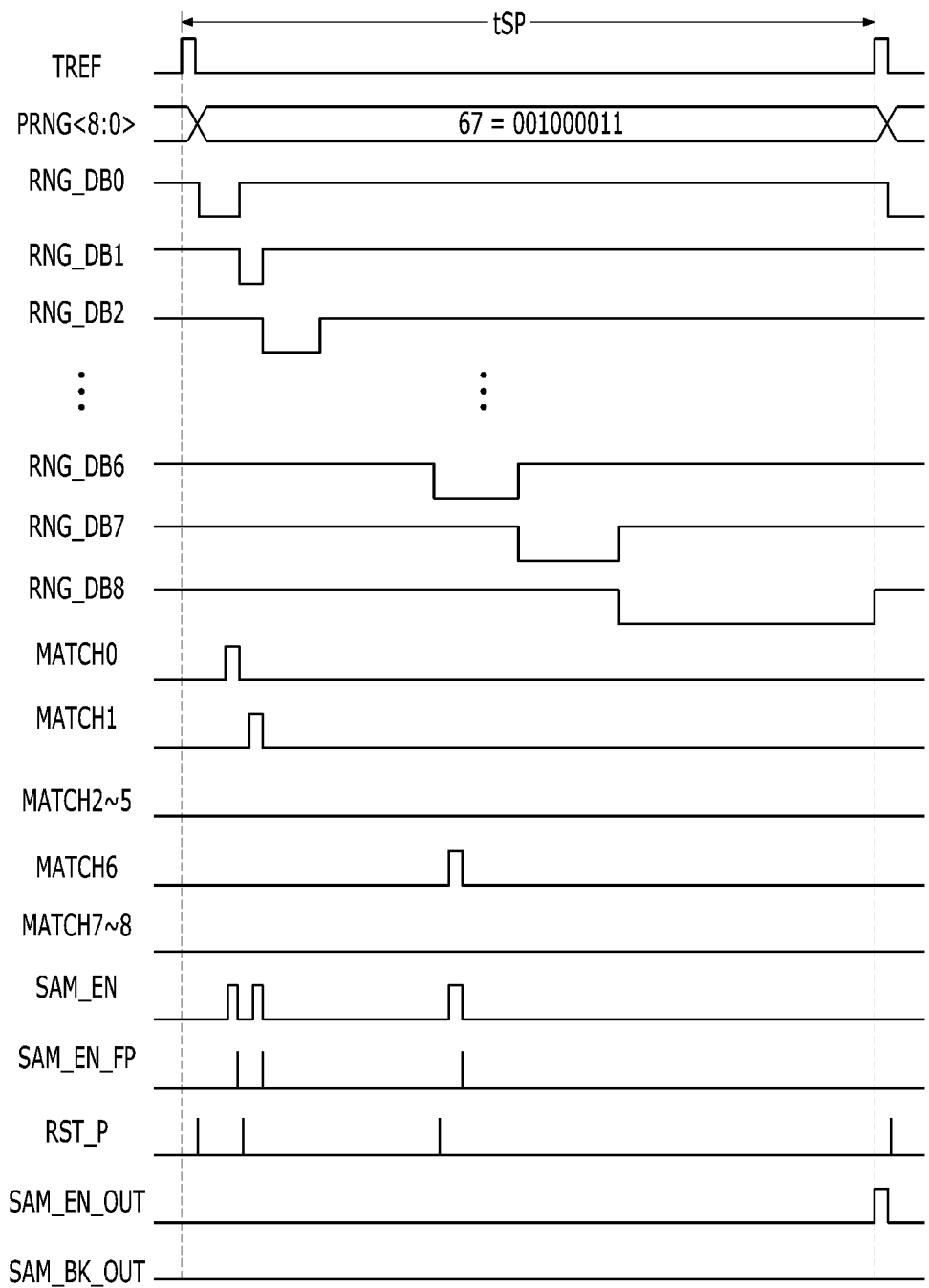
FIGS. 16 and 17 are waveform diagrams for describing a sampling operation in accordance with an embodiment of the present invention.

FIG. 16 is a waveform diagram for describing a sampling operation in accordance with an embodiment of the present invention.

Referring to FIG. 16, the random signal PRNG<8:0> of "001000011" (decimal 67) is set according to the target refresh command TREF, and 400 active commands ACT are inputted during the sampling period tSP.

According to the target refresh command TREF, the first to ninth section separators 234_1 to 234_9 may reset the first to ninth section definition signals RNG_DB0 to RNG_DB8 to a logic high level. The reset signal generation circuit 330 may activate the reset signal RST_P in synchronization with a falling edge of the target refresh command TREF.

After a predetermined delay time (D), the first section separator 234_1 may distinguish the first sub-section by activating the first section definition signal RNG_DB0 to a logic low level. The active counter 220 may increase the value of the active counting signal ACT_CNT<8:0> by "+1" each time the active command ACT is inputted. As the active counting bits of the active counting signal ACT_CNT<8:1> are sequentially high bits, the second to ninth section separators 234_2 to 234_9 may sequentially activate the second to ninth section definition signals RNG_DB1 to RNG_DB8.

The sampling input control circuit 310 may generate the sampling enable signal SAM_EN by comparing different random bits and active counting bits according to the first to ninth section definition signals RNG_DB0 to RNG_DB8. In detail, the first comparator 312_1 may generate the first match signal MATCH0 activated to a logic high level when the first random bit PRNG<0> and the first active counting bit ACT_CNT<0> are bits at the same level in a state where the first section definition signal RNG_DB0 is activated to a logic low level. The second comparator 312_2 may generate the second match signal MATCH1 activated to a logic high level when the first and second random bits PRNG<1:0> have respectively the same level as the first and second active counting bits ACT_CNT<1:0> in a state where the second section definition signal RNG_DB1 is activated to a logic low level. Similarly, the seventh comparator 312_7 may generate the seventh match signal MATCH6 activated to a logic high level when the first to seventh random bits PRNG<6:0> have respectively the same level as the first to seventh active counting bits ACT_CNT<6:0> in a state where the seventh section definition signal RNG_DB6 is activated.

The sampling output part 314 may generate the sampling enable signal SAM_EN according to the first match signal MATCH0, the second match signal MATCH1, and the seventh match signal MATCH6. The first pulse generator 322 may generate the sampling enable pulse SAM_EN_FP at the falling edge of the sampling enable signal SAM_EN. In this case, the sampling circuit 136 may store the active address ACT_ADD in the first input latches 410 and the second input latches 430 according to the sampling enable signal SAM_EN and the backup random signal SAM_BK, respectively.

Since the second random bit PRNG<1> and the seventh random bit PRNG<6> are high bits, the reset signal generation circuit 330 may activate the reset signal RST_P in synchronization with the active command ACT, in response to pulsing of the first section definition pulse RNG_P0 and the sixth section definition pulse RNG_P5 to a logic high level.

The sampling output control circuit 340 may generate the first preliminary output signal PRE_OUT1 and the second preliminary output signal PRE_OUT2 according to the sampling enable pulse SAM_EN_FP and reset signal RST_P, and output the first sampling output signal SAM_E-N_OUT and the second sampling output signal SAM_BK_OUT by inverting the first preliminary output signal PRE_OUT1 and the second preliminary output signal PRE_OUT2, respectively, when the target refresh command TREF is inputted. At this time, since the sampling enable pulse SAM_EN_FP pulses later than the reset signal RST_P, the first sampling output signal SAM_EN_OUT pulses by a logic high level in synchronization with the target refresh command TREF.

Accordingly, the sampling circuit 136 may output the address stored according to the sampling enable signal SAM_EN as the target address TADD according to the first sampling output signal SAM_EN_OUT. As a result, when the number of inputs of the active command ACT is greater than or equal to the set random signal PRNG<8:0>, the address stored according to the sampling enable signal SAM_EN may be used as the target address TADD.

Figure 17:
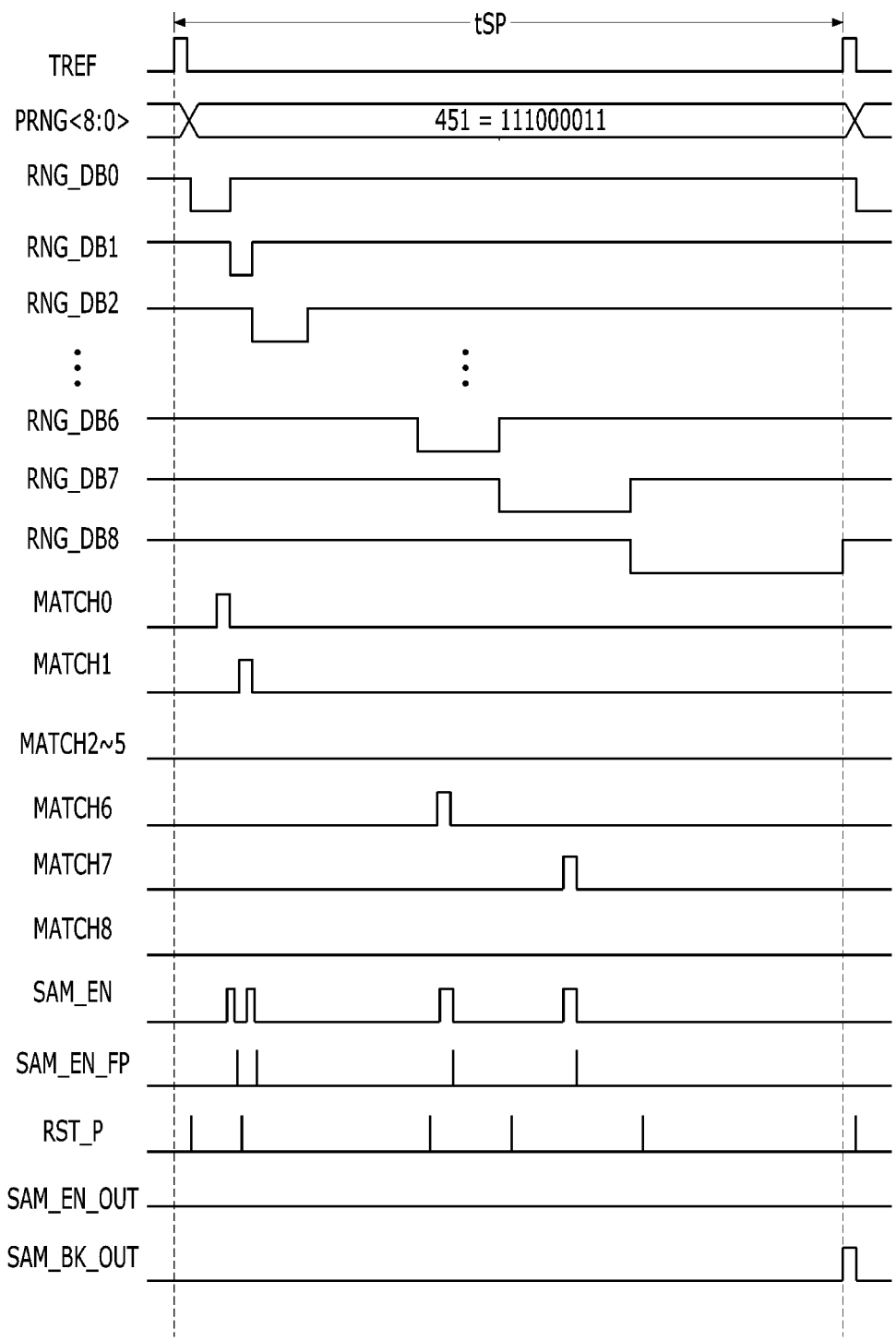

FIG. 17 is a waveform diagram for describing a sampling operation in accordance with an embodiment of the present invention.

Referring to FIG. 17, the random signal PRNG<8:0> of "111000011" (decimal 451) is set according to the target refresh command TREF, and 400 active commands ACT are inputted during the sampling period tSP.

In the same manner as described in FIG. 16, the first to ninth section definition signals RNG_DB0 to RNG_DB8 may be generated.

In addition to the first match signal MATCH0, the second match signal MATCH1 and the seventh match signal MATCH6, the sampling input control circuit 310 may generate the eighth match signal MATCH7 activated to a logic high level when the first to eighth random bits PRNG<7:0> have respectively the same level as the first to eighth active counting bits ACT_CNT<7:0> in a state where the eighth section definition signal RNG_DB7 is activated.

The sampling output unit 314 may generate the sampling enable signal SAM_EN according to the first match signal MATCH0, the second match signal MATCH1, the seventh match signal MATCH6, and the eighth match signal MATCH7. The first pulse generator 322 may generate the sampling enable pulse SAM_EN_FP at the falling edge of the sampling enable signal SAM_EN. In this case, the sampling circuit 136 may store the active address ACT_ADD in the first input latches 410 and the second input latches 430 according to the sampling enable signal SAM_EN and the backup random signal SAM_BK, respectively.

Since the second random bit PRNG<1>, the seventh random bit PRNG<6>, the eighth random bit PRNG<7>, and the ninth random bit PRNG<8> are high bits, the reset signal generation circuit 330 may activate the reset signal RST_P in synchronization with the active command ACT, in response to pulsing of the first section definition pulse RNG_P0, the sixth section definition pulse RNG_P5, the seventh section definition pulse RNG_P6, and the eighth section definition pulse RNG_P7 to a logic high level.

The sampling output control circuit 340 may generate the first preliminary output signal PRE_OUT1 and the second preliminary output signal PRE_OUT2 according to the sampling enable pulse SAM_EN_FP and reset signal RST_P, and output the first sampling output signal SAM_E-N_OUT and the second sampling output signal SAM_BK_OUT by inverting the first preliminary output signal PRE_OUT1 and the second preliminary output signal PRE_OUT2, respectively, when the target refresh command TREF is inputted. At this time, since the reset signal RST_P pulses later than the sampling enable pulse SAM_EN_FP, the second sampling output signal SAM_BK_OUT pulses by a logic high level in synchronization with the target refresh command TREF.

Accordingly, the sampling circuit 136 may output the address stored according to the backup random signal SAM_BK as the target address TADD according to the second sampling output signal SAM_BK_OUT. As a result, when the number of inputs of the active command ACT is smaller than the set random signal PRNG<8:0>, the address stored according to the backup random signal SAM_BK may be used as the target address TADD.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. An integrated circuit comprising:
a sampling control circuit configured to generate a sampling enable signal by dividing a sampling period into a plurality of sub-sections according to an active counting signal generated by counting a number of inputs of an active signal during the sampling period, and comparing the active counting signal with a random signal for each sub-section; and
a sampling circuit configured to sample and store an input address according to the sampling enable signal.

2. The integrated circuit of claim 1, wherein the sampling control circuit is configured to divide the sampling period by adjusting a number of the sub-sections according to the number of inputs of the active signal.

3. The integrated circuit of claim 1, wherein the sampling control circuit is configured to generate the sampling enable signal by comparing one or more target bits within the random signal with one or more target bits within the active counting signal for each of the sub-sections while varying numbers of the target bits within the random signal and the active counting signal for each of the sub-sections.

4. The integrated circuit of claim 1, wherein the sampling control circuit includes:
   an active counter configured to generate the active counting signal by counting the number of inputs of the active signal during the sampling period;
   a section definition circuit configured to generate, according to the active counting signal, a plurality of section definition signals respectively corresponding to the sub-sections; and
   a control signal generation circuit configured to generate the sampling enable signal by comparing a plurality of random bits included in the random signal with a plurality of active counting bits included in the active counting signal according to the section definition signals.

5. The integrated circuit of claim 4,
   wherein the section definition circuit includes a plurality of section separators coupled to each other in series, and
   wherein the section separators are configured to sequentially activate the section definition signals according to a sampling signal defining the sampling period while adjusting a number of the sub-sections according to the active counting bits.

6. The integrated circuit of claim 5,
   wherein the section separator at a first stage is configured to be set according to a delay signal of the sampling signal and each of remaining section separators of the section separators is configured to be set according to an output of a section separator at a previous stage, and
   wherein each of the section separators is configured to be reset according to the sampling signal or the active counting bits.

7. The integrated circuit of claim 4, wherein the control signal generation circuit includes:
   a sampling input control circuit configured to generate the sampling enable signal by comparing target bits between the random bits and the active counting bits while varying numbers of the target bits of the random bits and the active counting bits according to the section definition signals;
   a reset signal generation circuit configured to output, as a reset signal, a high bit among the random bits according to the section definition signals; and
   a sampling output control circuit configured to generate, in synchronization with a sampling signal defining the sampling period, a first sampling output signal or a second sampling output signal according to the sampling enable signal and the reset signal.

8. The integrated circuit of claim 7, wherein the sampling input control circuit includes:
   a plurality of comparators each configured to generate a match signal by comparing, according to the section definition signals, greater numbers of target bits between the random bits and the active counting bits than a comparator at a previous stage; and
   a sampling outputter configured to generate the sampling enable signal when one of the match signals is activated.

9. The integrated circuit of claim 7, wherein the reset signal generation circuit includes:
   a synchronization signal generation part configured to generate, in synchronization with the active signal, a plurality of synchronization pulses according to the section definition signals;
   a high-bit detection part configured to output, in synchronization with the synchronization pulses, the high bit as a plurality of seed reset signals; and
   a reset output part configured to generate the reset signal according to the seed reset signals or the sampling signal.

10. The integrated circuit of claim 7, wherein the sampling output control circuit includes:
    a sampling decision part configured to generate a first preliminary output signal, which is set in response to the sampling enable signal and reset in response to the reset signal, and configured to generate a second preliminary output signal, which is set in response to the reset signal and reset in response to the sampling enable signal; and
    an output control part configured to output, according to the sampling signal, the first preliminary output signal as the first sampling output signal and the second preliminary output signal as the second sampling output signal.

11. The integrated circuit of claim 10, wherein the sampling circuit includes:
    a first input latch configured to store the input address according to the sampling enable signal, and output the stored address to a common node according to the first sampling output signal;
    a second input latch configured to store the input address according to a backup random signal, and output the stored address to the common node according to the second sampling output signal; and
    an output latch configured to output, from the common node and according to the sampling signal, the address output to the common node.

12. The integrated circuit of claim 1, further comprising a random signal generation circuit configured to generate the random signal according to a sampling signal defining the sampling period.

13. The integrated circuit of claim 12, wherein the random signal generation circuit includes a pseudo-random number generator (PRNG) based on a linear feedback shift register (LFSR).

14. An integrated circuit comprising:
    a section definition circuit configured to divide a sampling period into a plurality of sub-sections according to an active counting signal representing a number of inputs of an active signal, and configured to generate a plurality of section definition signals respectively corresponding to the sub-sections;
    a sampling input control circuit configured to generate a sampling enable signal by comparing, according to the section definition signals, the active counting signal with a random signal;
    a reset signal generation circuit configured to output, as a reset signal, a high bit among a plurality of random bits of the random signal according to the section definition signals;
    a sampling output control circuit configured to output a first sampling output signal or a second sampling output signal according to the sampling enable signal and the reset signal; and
    a sampling circuit configured to output, according to the first sampling output signal, an address sampled by the sampling enable signal and configured to output, according to the second sampling output signal, an address sampled by a backup random signal.

15. The integrated circuit of claim 14,
wherein the section definition circuit includes a plurality of section separators coupled to each other in series, and
wherein the section separators are configured to sequentially activate the section definition signals according to a sampling signal defining the sampling period while adjusting a number of the sub-sections according to a plurality of active counting bits of the active counting signal.

16. The integrated circuit of claim 14, wherein the sampling input control circuit includes:
a plurality of comparators each configured to generate a match signal by comparing, according to the section definition signals, greater numbers of target bits between the random bits and a plurality of active counting bits than a comparator at a previous stage; and
a sampling outputter configured to generate the sampling enable signal when one of the match signals is activated.

17. The integrated circuit of claim 14, wherein the reset signal generation circuit includes:
a synchronization signal generation part configured to generate in synchronization with the active signal, a plurality of synchronization pulses according to the section definition signals;
a high-bit detection part configured to output, in synchronization with the synchronization pulses, the high bit as a plurality of seed reset signals; and
a reset output part configured to generate the reset signal according to the seed reset signals or the sampling signal.

18. The integrated circuit of claim 14, wherein the sampling output control circuit includes:
a sampling decision part configured to generate a first preliminary output signal, which is set in response to the sampling enable signal and reset in response to the reset signal, and configured to generate a second preliminary output signal, which is set in response to the reset signal and reset in response to the sampling enable signal; and
an output control part configured to output, according to the sampling signal, the first preliminary output signal as the first sampling output signal and the second preliminary output signal as the second sampling output signal.

19. The integrated circuit of claim 14, wherein the sampling circuit includes:
a first input latch configured to sample an input address according to the sampling enable signal, and output the sampled address to a common node according to the first sampling output signal;
a second input latch configured to sample the input address according to the backup random signal, and output the sampled address to the common node according to the second sampling output signal; and
an output latch configured to output, from the common node and according to the sampling signal, the address output to the common node.

20. The integrated circuit of claim 14, further comprising:
a first random signal generation circuit configured to generate the random signal according to a sampling signal defining the sampling period; and
a second random signal generation circuit configured to generate the backup random signal that is randomly activated.

21. The integrated circuit of claim 20, wherein the first random signal generation circuit includes a pseudo-random number generator (PRNG), and the second random signal generation circuit includes a pseudo-random binary sequence (PRBS) random pattern generator.

22. A memory device comprising:
an active counter configured to generate an active counting signal by counting a number of inputs of an active command during a sampling period;
a section definition circuit configured to generate, according to the active counting signal, a plurality of section definition signals for dividing a sampling period into a plurality of sub-sections;
a control signal generation circuit configured to generate a sampling enable signal by comparing, according to the section definition signals, a random signal with the active counting signal; and
a sampling circuit configured to output a target address by sampling an active address according to the sampling enable signal.

23. The memory device of claim 22,
wherein the section definition circuit includes a plurality of section separators coupled to each other in series, and
wherein the section separators are configured to sequentially activate the section definition signals according to a target refresh command while adjusting a number of the sub-sections according to a plurality of active counting bits of the active counting signal.

24. The memory device of claim 22, further comprising:
a reset signal generation circuit configured to output, as a reset signal, a high bit among a plurality of random bits of the random signal according to the section definition signals; and
a sampling output control circuit configured to output a first sampling output signal or a second sampling output signal according to the sampling enable signal and the reset signal.

25. The memory device of claim 24, wherein the sampling circuit includes:
a first input latch configured to sample the active address according to the sampling enable signal, and output the sampled address to a common node according to the first sampling output signal;
a second input latch configured to sample the active address according to a backup random signal, and output the sampled address to the common node according to the second sampling output signal; and
an output latch configured to output, from the common node, the address, which is output to the common node, as the target address according to a target refresh command.

26. The memory device of claim 22, further comprising:
a random signal generation circuit configured to generate the random signal according to a target refresh command; and
a row control circuit configured to refresh one or more word lines corresponding to the target address according to the target refresh command.

27. An operating method of a memory device, the operating method comprising:
sampling an address as individual first and second addresses respectively according to first and second random signals; and
outputting, as a target address for a target refresh operation, the individual first and second addresses respectively according to third and fourth random signals, wherein the sampling includes generating the first random signal according to sub-section signals, which sequentially stay enabled during respective sub-sections within a section, a number of the sub-section signals depending on a number of times that an active signal is enabled during the section, and wherein the outputting includes generating each of the third and fourth random signals based on the first random signal and the sub-section signals.

* * * * *